US009628020B2

(12) United States Patent
Kobayashi et al.

(10) Patent No.: US 9,628,020 B2
(45) Date of Patent: Apr. 18, 2017

(54) SEMICONDUCTOR CIRCUIT, OSCILLATOR, ELECTRONIC APPARATUS, AND MOVING OBJECT

(71) Applicant: Seiko Epson Corporation, Tokyo (JP)

(72) Inventors: Hitoshi Kobayashi, Okaya (JP); Yoshiki Makiuchi, Minowa-machi (JP); Takeshi Yasui, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/863,767

(22) Filed: Sep. 24, 2015

(65) Prior Publication Data

US 2016/0094182 A1 Mar. 31, 2016

(30) Foreign Application Priority Data

Sep. 26, 2014 (JP) ................................ 2014-197150

(51) Int. Cl.
*H03B 5/32* (2006.01)

(52) U.S. Cl.
CPC ....... *H03B 5/32* (2013.01); *H03B 2200/0026* (2013.01)

(58) Field of Classification Search
CPC ................................ H03K 3/354; H03B 5/32
USPC ..................................... 331/116 R, 154, 158
See application file for complete search history.

(56) References Cited

U.S. PATENT DOCUMENTS 5,898,344 A * 4/1999 Hayashi ............... H05K 3/3405 331/67
7,221,232 B2 * 5/2007 Sugiura .................. H03B 5/326 331/107 A
2005/0110588 A1 * 5/2005 Matsuo ............... H03B 5/1847 331/167
2012/0161889 A1 * 6/2012 Ozawa .................. H03B 5/364 331/116 FE
2012/0194284 A1 * 8/2012 Souma .................. H03B 5/364 331/158

FOREIGN PATENT DOCUMENTS

| | | | |
|---|---|---|---|
| JP | 06-152240 | A | 5/1994 |
| JP | 06-259164 | A | 9/1994 |
| JP | 2000-286635 | A | 10/2000 |
| JP | 2002-033457 | A | 1/2002 |
| JP | 2006-054269 | A | 2/2006 |
| JP | 2010-016586 | A | 1/2010 |
| JP | 2012-205180 | A | 10/2012 |

* cited by examiner

*Primary Examiner* — Jeffrey Shin
(74) *Attorney, Agent, or Firm* — Oliff PLC

(57) ABSTRACT

A semiconductor circuit includes an oscillation circuit; an output circuit that receives a first oscillation signal from the oscillation circuit and outputs a second oscillation signal; a DC circuit that receives a voltage based on a power supply voltage and outputs at least one of a DC voltage and a DC current; and a semiconductor substrate on which the oscillation circuit, the output circuit, and the DC circuit are formed. In a plan view of the semiconductor substrate, the DC circuit is disposed between the oscillation circuit and the output circuit.

18 Claims, 5 Drawing Sheets

112
102
100 SEMICONDUCTOR SUBSTRATE
PAD
121
123
121
5
OUTPUT CIRCUIT
104
103
6
PAD
113
DC CIRCUIT
124
124
4
OSCILLATION CIRCUIT
122
122
PAD
PAD
110
111
101

SEMICONDUCTOR CIRCUIT, OSCILLATOR, ELECTRONIC APPARATUS, AND MOVING OBJECT

BACKGROUND

1. Technical Field

The present invention relates to a semiconductor circuit, an oscillator, an electronic apparatus, and a moving object.

2. Related Art

JP-A-2006-54269 discloses an oscillator having a configuration in which a digital circuit block such as a memory is disposed between a DC circuit block and an AC circuit block and thereby the DC circuit block and the AC circuit block are separated from each other, in order to reduce characteristic degradation due to interference between the DC circuit block and the AC circuit block, in an analog circuit block.

However, according to the oscillator described in JP-A-2006-54269, there is a case in which an analog circuit, for example, an oscillation circuit and an output circuit (a circuit outputs that a signal from the oscillation circuit, buffer, amplifier, or the like) are disposed in the same analog circuit region, and thereby, there is a probability that characteristic degradation or the like of an output signal occurs due to interference between a signal of the oscillation circuit and a signal of the output circuit.

SUMMARY

An advantage of an aspect of the invention is to provide a semiconductor circuit that can reduce the characteristic degradation of an output signal due to interference between a signal of an oscillation circuit and a signal of an output circuit. In addition, an advantage of another aspect of the invention is to provide an oscillator, an electronic apparatus, and a moving object which use the semiconductor circuit.

The invention can be implemented as the following forms or application examples.

Application Example 1

A semiconductor circuit according to this application example includes: an oscillation circuit that outputs a first oscillation signal; an output circuit that receives the first oscillation signal and outputs a second oscillation signal; a DC circuit that receives a voltage based on a power supply voltage and outputs at least one of a DC voltage and a DC current; and a semiconductor substrate on which the oscillation circuit, the output circuit, and the DC circuit are formed, in which in a plan view of the semiconductor substrate, the DC circuit is disposed between the oscillation circuit and the output circuit.

The oscillation circuit may be, for example, a voltage controlled oscillation circuit or a temperature compensated oscillation circuit.

The oscillation circuit may be a portion or entirety of various oscillation circuits, such as a Pierce oscillation circuit, an inverter type oscillation circuit, a Colpitts oscillation circuit, or a Hartley oscillation circuit.

The voltage based on the power supply voltage may be the power supply voltage itself, and may be, for example, a constant voltage that is generated from the power supply voltage.

In the semiconductor circuit according to this application example, for example, in a plan view of the semiconductor substrate, the DC circuit may be disposed so as to intersect at least one of virtual straight lines that intersect (for example, orthogonal to) both of the oscillation circuit and the output circuit, between the oscillation circuit and the output circuit.

According to the semiconductor circuit of this application example, the DC circuit is disposed between the oscillation circuit and the output circuit that respectively generate the oscillation signals with frequency components, the DC circuit functions as an electromagnetic shield, and thereby electromagnetic coupling between the oscillation circuit and the output circuit is reduced. Thus, according to the semiconductor circuit of this application example, it is possible to reduce characteristic degradation of an output signal due to interference between the signal of the oscillation circuit and the signal of the output circuit. For example, it is possible to reduce degradation of frequency stability of the first oscillation signal that is output from the oscillation circuit, and to reduce phase noise or jitter of the second oscillation signal that is output from the output circuit.

Application Example 2

The semiconductor circuit according to the application example may further include: a first pad that is electrically connected to the oscillation circuit and is electrically connected to a terminal of a resonator; and a second pad that is electrically connected to a terminal of the output circuit from which the second oscillation signal is output, in which the first pad and the second pad may be formed on the semiconductor substrate, and in a plan view of the semiconductor substrate, the oscillation circuit may be disposed between the first pad and the DC circuit, and the output circuit may be disposed between the second pad and the DC circuit.

The resonator may be an electrical resonance circuit, and may be an electromechanical resonator or the like.

In the semiconductor circuit according to this application example, for example, in a plan view of the semiconductor substrate, the oscillation circuit may be disposed so as to intersect at least one of virtual straight lines that intersect (for example, orthogonal to) both of the first pad and the DC circuit, between the first pad and the DC circuit.

In addition, in the semiconductor circuit according to this application example, for example, in a plan view of the semiconductor substrate, the output circuit may be disposed so as to intersect at least one of virtual straight lines that intersect (for example, orthogonal to) both of the second pad and the DC circuit, between the second pad and the DC circuit.

According to the semiconductor circuit of this application example, it is also possible to decrease electromagnetic coupling between the first pad that is connected to the oscillation circuit and the resonator, and the second pad that is connected to the output circuit, and it is possible to further reduce characteristic degradation due to interference between the signal of the oscillation circuit and the signal of the output circuit.

Application Example 3

The semiconductor circuit according to the application example may include: a first side, a second side, and a plurality of sides that respectively connects the first side to the second side, in which in a plan view of the semiconductor substrate, the first pad may be disposed between the first side and the oscillation circuit, and the second pad may be disposed between the second side and the output circuit.

In the semiconductor circuit according to this application example, for example, in a plan view of the semiconductor substrate, the first pad may be disposed so as to intersect at least one of virtual straight lines that intersect (for example, orthogonal to) both of the first side and the oscillation circuit, between the first side and the oscillation circuit.

In addition, in the semiconductor circuit according to this application example, for example, in a plan view of the semiconductor substrate, the second pad may be disposed so as to intersect at least one of virtual straight lines that intersect (for example, orthogonal to) both of the second side and the oscillation circuit, between the second side and the oscillation circuit.

In the semiconductor circuit according to this application example, the first pad is disposed along the first side of the semiconductor substrate, and the second pad is disposed along the second side separated from the first side of the semiconductor substrate, and thus the electromagnetic coupling between the first pad and the second pad is further reduced. In addition, since the first pad and the second pad are respectively disposed along the first side and the second side of the semiconductor substrate, the first pad and the second pad are easily connected to external terminals of the semiconductor circuit.

Application Example 4

The semiconductor circuit according to the application example may further include: a third pad that is formed on the semiconductor substrate, is electrically connected to the semiconductor circuit, and is for confirming an operation state of the semiconductor circuit, in which in a plan view of the semiconductor substrate, the third pad may be disposed along one side of the plurality of sides, and the DC circuit may intersect a virtual straight line that connects the third pad to the first pad.

The third pad may be connected to, for example, an input terminal for test of the semiconductor circuit, or an output terminal for monitor.

In the semiconductor circuit according to this application example, the DC circuit is disposed between the first pad that is connected to the oscillation circuit, and the third pad for confirming an operation state of the semiconductor circuit, and thereby, electromagnetic coupling between the oscillation circuit and the third pad is reduced. Thus, for example, it is possible to decrease the possibility of malfunction of the semiconductor circuit due to noise being superimposed on the third pad by an operation of the oscillation circuit.

Application Examples 5, 6, 7, and 8

In the semiconductor circuit according to the application example, in a plan view of the semiconductor substrate, when a length of an area in which the DC circuit is interposed between the oscillation circuit and the output circuit in a first direction that intersects a direction in which the oscillation circuit is connected to the output circuit is referred to as L1, and a shorter length among a length in the first direction of the oscillation circuit and a length in the first direction of the output circuit is referred to as L2, the lengths L1 and L2 may satisfy a relationship of $0.5\times L2 \le L1 \le L2$.

For example, in the semiconductor circuit according to this application example, when, in a plan view of the semiconductor substrate, a distance between two virtual straight lines that are farthest away from each other is referred to as L1, among the virtual straight lines that intersect (for example, orthogonal to) the oscillation circuit and that intersect the output circuit and the DC circuit, and a shorter length is referred to as L2, among a length in a direction perpendicular to the two virtual straight lines of the oscillation circuit, and a length in a direction perpendicular to the two virtual straight lines of the output circuit, L1 is equal to or longer than 50% of L2.

In addition, for example, in the semiconductor circuit according to this application example, when, in a plan view of the semiconductor substrate, a distance between two virtual straight lines which are orthogonal to both of the oscillation circuit and the output circuit, intersect the DC circuit, and are farthest away from each other, is referred to as L1, and a shorter length among a length in a direction perpendicular to the two virtual straight lines of the oscillation circuit, and a length in a direction perpendicular to the two virtual straight lines of the output circuit, is referred to as L2, L1 is equal to or longer than 50% of L2.

According to the semiconductor circuit according to these application examples, even when the oscillation circuit faces the output circuit, it is possible to efficiently decrease electromagnetic coupling between the oscillation circuit and the output circuit caused by a shield effect obtained by the DC circuit.

Application Examples 9, 10, 11, 12, and 13

In the semiconductor circuit according to the application example, the DC circuit may include a regulator circuit that outputs a voltage or a current by converting a voltage which is input.

A voltage or a current that is output from the regulator circuit may be input to at least one of the oscillation circuit and the output circuit.

According to the semiconductor circuit of these application examples, the regulator circuit for decreasing electrical coupling between the oscillation circuit and the output circuit is used, and thus it is possible to perform an efficient layout arrangement of the semiconductor circuit.

Application Example 14

An oscillator according to this application example includes: any of the semiconductor circuits and a resonator.

According to this application example, in the semiconductor device, characteristic degradation of the output signal due to interference between the signal of the oscillation circuit and the signal of the output circuit can be reduced, and thus it is possible to realize an oscillator with high reliability.

Application Examples 15 and 16

An electronic apparatus according to each of these application examples includes: any of the semiconductor circuits or the oscillator.

Application Examples 17 and 18

A moving object according to each of these application examples includes: any of the semiconductor circuits or the oscillator.

According to these application examples, a semiconductor circuit or an oscillator is used, which can reduce characteristic degradation of an output signal due to interference between a signal of an oscillation circuit and a signal of an output circuit, and thus it is possible to realize an electronic apparatus and a moving object which have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments that will be described below do not unduly limit the content of the invention described in the scope of the appended Claims. In addition, all of the configurations that will be described below are not essential configuration requirements of the invention.

1. Oscillator

1-1. First Embodiment

Figure 1:
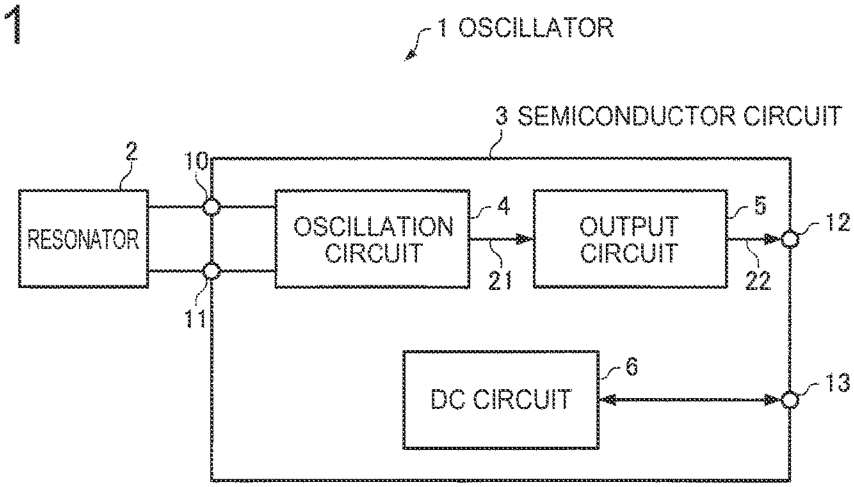
FIG. 1 is a configuration diagram of an oscillator according to a first embodiment.

FIG. 1 is a block diagram illustrating a configuration of an oscillator according to a first embodiment. As illustrated in FIG. 1, an oscillator 1 according to the first embodiment is configured to include a resonator 2 and a semiconductor circuit 3. The resonator 2 and the semiconductor circuit 3 are accommodated in a package that is not illustrated.

The resonator 2 is electrically connected to an external terminal 10 and an external terminal 11 of the semiconductor circuit 3.

The resonator 2 may be, for example, a vibrator. The vibrator may be, for example, a piezoelectric vibrator, a surface acoustic wave (SAW) resonator, a micro electro mechanical systems (MEMS) vibrator, or the like. In addition, piezoelectric monocrystaline such as quartz, lithium tantalite, or lithium niobate, a piezoelectric material such as including a piezoelectric ceramic lead zirconate titanate, or silicon semiconductor material can be used as a substrate material of the vibrator. A unit using piezoelectric effect may be used, or electrostatic drive caused by Coulomb force may be used, as excitation means of the vibrator. In addition, the resonator 2 may be an optical resonator using light in which a gas cell containing an alkali metal or the like interacts with atoms of an alkali metal or the like, a cavity resonator or a dielectric resonator that resonates at a microwave region, an LC resonator, or the like.

The semiconductor circuit 3 is configured to include an oscillation circuit 4, an output circuit 5, and a DC circuit 6. The semiconductor circuit 3 may be formed by an integrated circuit (IC).

The oscillation circuit 4 is electrically connected to the external terminal 10 and the external terminal 11 of the semiconductor circuit 3. Thus, the oscillation circuit 4 is electrically connected to the resonator 2 through the external terminal 10 and the external terminal 11 of the semiconductor circuit 3, and outputs an oscillation signal 21 (first oscillation signal) by oscillating the resonator 2. For example, the oscillation circuit 4 may be configured to include an amplification circuit that amplifies an output signal of the resonator 2 and feeds back the output signal to the resonator 2, and may be configured to include a capacitor circuit and a resistor circuit that determine the frequency (oscillation frequency) of the oscillation signal 21. In addition, the oscillation circuit 4 may be configured to include a level shift circuit that converts the amplitude of the output signal of the amplification circuit. For example, the oscillation signal 21 may be the output signal of the amplification circuit or an output signal of the level shift circuit.

Various oscillation circuits, such as a Pierce oscillation circuit, an inverter type oscillation circuit, a Colpitts oscillation circuit, or a Hartley oscillation circuit may be configured by the oscillation circuit 4 and the resonator 2.

The output circuit 5 receives the oscillation signal 21 from the oscillation circuit 4 and outputs an oscillation signal 22 (second oscillation signal). The output circuit 5 may output the oscillation signal 22 of, for example, a complementary metal-oxide semiconductor (CMOS) level. In addition, the output circuit 5 may be configured to include, for example, a buffer circuit, and may be configured to include a level shift circuit that converts the amplitude of the oscillation signal 21, or a frequency dividing circuit that divides the frequency of the oscillation signal 21. The oscillation signal 22 may be, for example, an output signal of a buffer circuit, or an output signal of a frequency dividing circuit, and outputs the output signal to an external device from an external terminal 12 of the semiconductor circuit 3.

The DC circuit 6 inputs a voltage based on a power supply voltage, and outputs at least one of a DC voltage and a DC current. The power supply voltage may be input from an external terminal (power supply terminal) of the semiconductor circuit 3. For example, the DC circuit 6 may be configured to include a regulator circuit that converts a voltage to be input and outputs a voltage or a current. The DC circuit 6 is electrically connected to an external terminal 13 of the semiconductor circuit 3.

Figure 2:
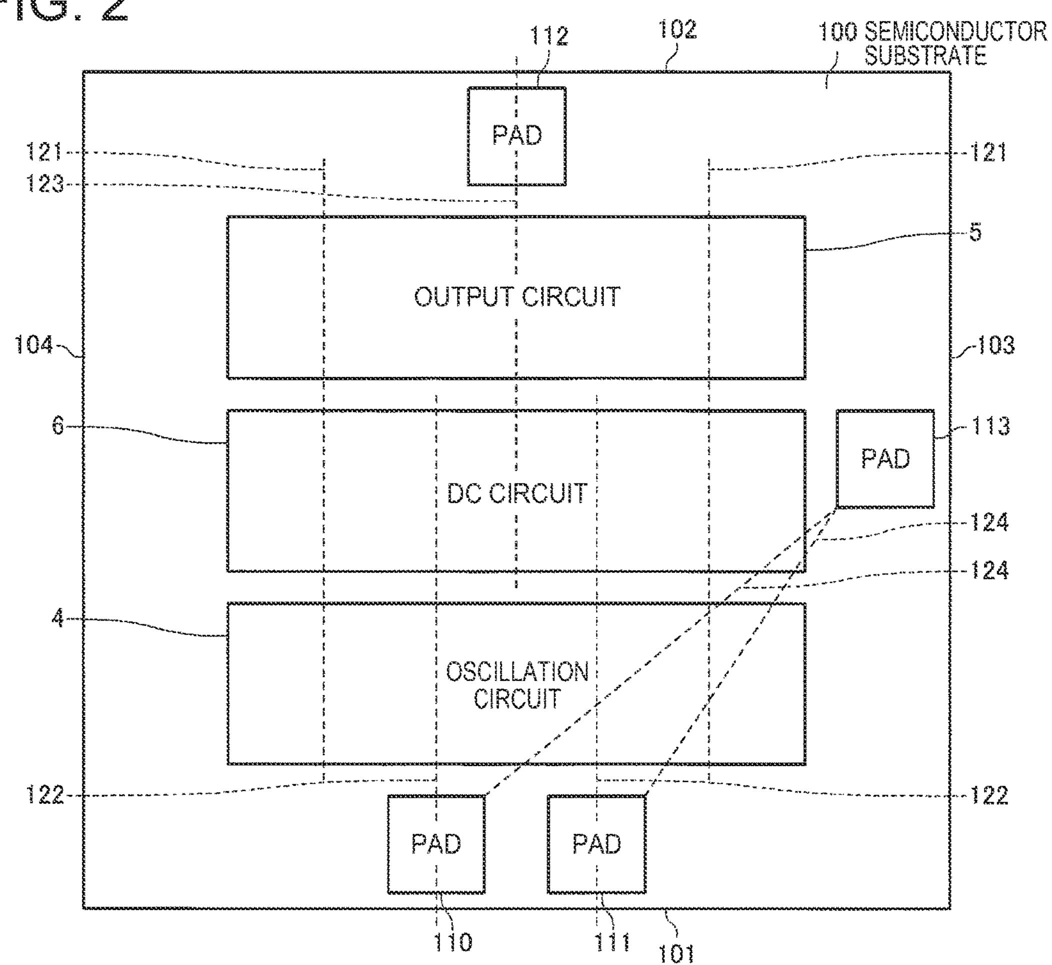
FIG. 2 is a diagram illustrating an example of a layout arrangement of a semiconductor circuit according to the first embodiment.

FIG. 2 is a diagram illustrating an example of a layout arrangement of the semiconductor circuit 3 in the oscillator 1 according to the first embodiment. As illustrated in FIG. 2, the semiconductor circuit 3 includes the oscillation circuit 4, the output circuit 5, and the DC circuit 6 which are illustrated in FIG. 1, on a semiconductor substrate 100. Thus, in a plan view of the semiconductor substrate 100, the DC circuit 6 is disposed between the oscillation circuit 4 and the output circuit 5. For example, in a plan view of the semiconductor substrate 100, the DC circuit 6 may be disposed so as to intersect at least one of virtual straight lines 121 that intersect (for example, orthogonal to) both of the oscillation circuit 4 and the output circuit 5, between the oscillation circuit 4 and the output circuit 5.

In addition, the semiconductor circuit 3 includes pads 110 (first pad) and 111 (first pad) on the semiconductor substrate 100. The pads 110 and 111 are electrically connected to the oscillation circuit 4, and electrically connected to terminals (two terminals) of the resonator 2. Specifically, the pad 110 is electrically connected to the external terminal of the semiconductor circuit 3, and is electrically connected to one terminal of the resonator 2 through the external terminal 10. In addition, the pad 111 is electrically connected to the external terminal 11 of the semiconductor circuit 3, and is electrically connected to the other terminal of the resonator 2 through the external terminal 11.

In addition, the semiconductor circuit 3 includes a pad 112 (second pad) on the semiconductor substrate 100. The pad 112 is electrically connected to a terminal of the output circuit 5 that outputs the oscillation signal 22. The pad 112 is also electrically connected to the external terminal 12 of the semiconductor circuit 3.

In the present embodiment, in a plan view of the semiconductor substrate 100, the oscillation circuit 4 is disposed between the pad 110 (or the pad 111) and the DC circuit 6. For example, in a plan view of the semiconductor substrate 100, the oscillation circuit 4 may be disposed so as to intersect at least one of virtual straight lines 122 that intersect (for example, orthogonal to) both of the pad 110 (or the pad 111) and the DC circuit 6, between the pad 110 (or the pad 111) and the DC circuit 6.

In addition, in the present embodiment, in a plan view of the semiconductor substrate 100, the output circuit 5 is disposed between the pad 112 and the DC circuit 6. For example, in a plan view of the semiconductor substrate 100, the output circuit 5 may be disposed so as to intersect at least one of virtual straight lines 123 that intersect (for example, orthogonal to) both of the pad 112 and the DC circuit 6, between the pad 112 and the DC circuit 6.

The semiconductor substrate 100 includes a side 101 (first side), a side 102 (second side), and a plurality of sides 103 and 104 that respectively connects the side 101 to the side 102. For example, the semiconductor substrate 100 is a rectangle, and in a plan view of the semiconductor substrate 100, the pad 110 and the pad 111 are disposed between the side 101 and the oscillation circuit 4. For example, in a plan view of the semiconductor substrate 100, the pad 110 and the pad 111 may be disposed so as to intersect at least one of the virtual straight lines 122 that intersect (for example, orthogonal to) both of the side 101 and the oscillation circuit 4, between the pad 101 and the oscillation circuit 4.

In addition, in a plan view of the semiconductor substrate 100, the pad 112 is disposed between the side 102 and the output circuit 5. For example, in a plan view of the semiconductor substrate 100, the pad 112 may be disposed so as to intersect at least one of the virtual straight lines 123 that intersect (for example, orthogonal to) both of the side 102 and the output circuit 5, between the pad 102 and the output circuit 5.

In addition, the semiconductor circuit 3 may include a pad 113 (third pad) on the semiconductor substrate 100. The pad 113 is a pad for confirming an operation state of the semiconductor circuit 3, and is electrically connected to the semiconductor circuit 3. The pad 113 is electrically connected to the external terminal 13 of the semiconductor circuit 3. In a plan view of the semiconductor substrate 100, the pad 113 is disposed along the side 103 that is one of a plurality of sides that connects the side 101 to the side 102. The DC circuit 6 intersects a virtual straight line 124 that connects the pad 113 to the pad 110 (or the pad 111).

According to the oscillator 1 or the semiconductor circuit 3 of the first embodiment described above, the DC circuit 6 is disposed between the oscillation circuit 4 and the output circuit 5 that respectively generate the oscillation signals 21 and 22 with frequency components, and the DC circuit functions as an electromagnetic shield. Accordingly, electromagnetic coupling between the oscillation circuit 4 and the output circuit 5 is reduced. Thus, according to the oscillator 1 or the semiconductor circuit 3 of the first embodiment, it is possible to reduce characteristic degradation of an output signal due to interference between the signal of the oscillation circuit 4 and the signal of the output circuit 5, that is, characteristic degradation of the oscillation signal 21 or the oscillation signal 22. For example, it is possible to reduce degradation of frequency stability of the oscillation signal 21 that is output from the oscillation circuit 4, and to reduce phase noise or jitter of the oscillation signal 22 that is output from the output circuit 5.

Furthermore, the output circuit 5 includes a frequency dividing circuit, and when the oscillation signal 22 which is obtained by dividing the frequency of the oscillation signal 21 using the frequency dividing circuit is output, the frequency of the oscillation signal 21 becomes an integer multiple of the frequency of the oscillation signal 22. Thus, spurious emissions of harmonics are likely to occur in the oscillation signal 22. However, the DC circuit 6 functions as an electromagnetic shield, and thus it is possible to reduce the spurious emissions.

In addition, according to the oscillator 1 or the semiconductor circuit 3 of the first embodiment, the pads 110 and 111 connected to the oscillation circuit 4 and the resonator 2 are disposed along the side 101 of the semiconductor substrate 100, the pad 112 that is connected to the output circuit 5 is disposed along the side 102 separated from the side 101 of the semiconductor substrate 100, and the oscillation circuit 4, the output circuit 5, and the DC circuit 6 are disposed between the pads 110 and 111 and the pad 112. Thus, the pads 110 and 111 are separated from the pad 112, the DC circuit 6 is disposed between the pads 110 and 111 and the pad 112, and thus electromagnetic coupling between the pads 110 and 111 and the pad 112 is reduced. In addition, since the pads 110 and 111 are disposed along the side 101 of the semiconductor substrate 100, the pads 110 and 111 are respectively and easily connected to the external terminal 10 and the external terminal 11 of the semiconductor circuit 3. At the same time, since the pad 112 is disposed along the side 102 of the semiconductor substrate 100, the pad 112 is easily connected to the external terminal 12 of the semiconductor circuit 3.

In addition, according to the oscillator 1 or the semiconductor circuit 3 of the first embodiment, the DC circuit 6 is disposed between the pads 110 and 111 that are connected to the oscillation circuit 4, and the pad 113 for confirming an operation state of the semiconductor circuit 3, and thereby, electromagnetic coupling between the oscillation circuit 4 and the pad 113 is reduced. Thus, for example, it is possible to decrease the possibility of malfunction of the semiconductor circuit 3 due to noise being superimposed on the pad 113 by an operation of the oscillation circuit 4.

1-2. Second Embodiment

Figure 3:
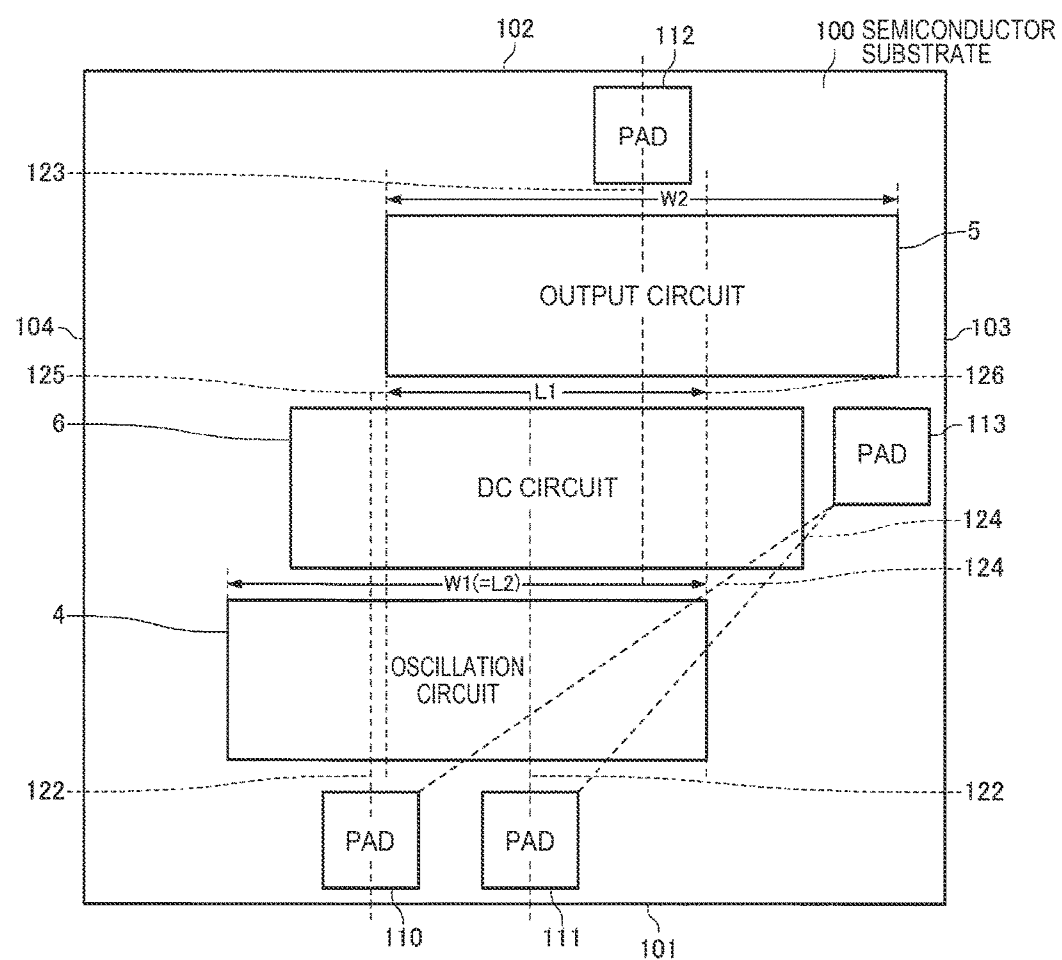
FIG. 3 is a diagram illustrating an example of a layout arrangement of a semiconductor circuit according to a second embodiment.

A configuration of the oscillator 1 according to a second embodiment is the same as that of FIG. 1, and thus description thereof will be omitted. In the oscillator 1 according to the second embodiment, a layout arrangement of the semiconductor circuit 3 is different from that of the first embodiment. FIG. 3 is a diagram illustrating an example of the layout arrangement of the semiconductor circuit 3 of the oscillator 1 according to the second embodiment. In FIG. 3, the same symbols or reference numerals will be attached to the same configuration elements as in FIG. 2, and description thereof will be omitted. As illustrated in FIG. 3, the semiconductor circuit 3 according to the second embodiment includes the oscillation circuit 4, the output circuit 5, and the DC circuit 6 which are illustrated in FIG. 2, on the semiconductor substrate 100, but arrangement thereof is different from that of FIG. 2. In a plan view of the semiconductor substrate 100, the DC circuit 6 is disposed between the oscillation circuit 4 and the output circuit 5, but the oscillation circuit 4 and the output circuit 5 are obliquely disposed so as to interpose the DC circuit 6.

In the second embodiment, in a plan view of the semiconductor substrate 100, a length of an area is referred to as L1 in which the DC circuit 6 is interposed between the oscillation circuit 4 and the output circuit 5 in a first direction that intersects a direction (direction in which the virtual straight lines 125 and 125, or the like extend) in which the oscillation circuit 4 is connected to the output circuit 5, a shorter length is referred to as L2, among a length W1 in the first direction of the oscillation circuit 4 and a length W2 in the first direction of the output circuit 5, and then L1 and L2 satisfy a relationship of 0.5×L2≤L1≤L2.

In other words, when, in a plan view of the semiconductor substrate 100, a distance (distance between the virtual straight line 125 and a virtual straight line 126) between two virtual straight lines that are farthest away from each other is referred to as L1, among the virtual straight lines that intersect (for example, orthogonal to) the oscillation circuit 4 and intersect the output circuit 5, and a shorter length is referred to as L2, among a length W1 in a direction perpendicular to the two virtual straight lines (virtual straight lines 125 and 126) of the oscillation circuit 4, and a length W2 in a direction perpendicular to the two virtual straight lines (virtual straight lines 125 and 126) of the output circuit 5, L1 is equal to or longer than 50% of L2. Then, the DC circuit 6 intersects the two virtual straight lines (virtual straight lines 125 and 126).

Alternatively, when, in a plan view of the semiconductor substrate 100, a distance (distance between the virtual straight line 125 and the virtual straight line 126) between two virtual straight lines that are orthogonal to both of the oscillation circuit 4 and the output circuit 5 and are farthest away from each other is referred to as L1, and a shorter length is referred to as L2, among the length W1 in a direction perpendicular to the two virtual straight lines (virtual straight lines 125 and 126) of the oscillation circuit 4, and a length W2 in a direction perpendicular to the two virtual straight lines (virtual straight lines 125 and 126) of the output circuit 5, L1 is equal to or longer than 50% of L2. The DC circuit 6 may intersect the two virtual straight lines (virtual straight lines 125 and 126).

In addition, also in the second embodiment, in a plan view of the semiconductor substrate 100, the oscillation circuit 4 is disposed between the pad 110 (or the pad 111) and the DC circuit 6. For example, in a plan view of the semiconductor substrate 100, the oscillation circuit 4 may be disposed so as to intersect at least one of the virtual straight lines 122 that intersect (for example, orthogonal to) both of the pad 110 (or the pad 111) and the DC circuit 6, between the pad 110 (or the pad 111) and the DC circuit 6.

In addition, in a plan view of the semiconductor substrate 100, the output circuit 5 is disposed between the pad 112 and the DC circuit 6. For example, in a plan view of the semiconductor substrate 100, the output circuit 5 may be disposed so as to intersect at least one of the virtual straight lines 123 that intersect (for example, orthogonal to) both of the pad 112 and the DC circuit 6, between the pad 112 and the DC circuit 6.

In addition, in a plan view of the semiconductor substrate 100, the pad 110 and the pad 111 are disposed between the side 101 and the oscillation circuit 4. For example, in a plan view of the semiconductor substrate 100, the pad 110 and the pad 111 may be disposed so as to intersect at least one of the virtual straight lines 122 that intersect (for example, orthogonal to) both of the side 101 and the oscillation circuit 4, between the side 101 and the oscillation circuit 4.

In addition, in a plan view of the semiconductor substrate 100, the pad 112 is disposed between the side 102 and the output circuit 5. For example, in a plan view of the semiconductor substrate 100, the pad 112 may be disposed so as to intersect at least one of the virtual straight lines 123 that intersect (for example, orthogonal to) both of the side 102 and the output circuit 5, between the side 102 and the output circuit 5.

In addition, in a plan view of the semiconductor substrate 100, the pad 113 is disposed along the side 103 that is one of the plurality of sides that connects the side 101 and the side 102. The DC circuit 6 intersects the virtual straight line 124 that connects the pad 113 to the pad 110 (or the pad 111).

The oscillator 1 or the semiconductor circuit 3 according to the second embodiment described above has the same effect as that of the oscillator 1 or the semiconductor circuit 3 according to the first embodiment. In addition, according to the oscillator 1 or the semiconductor circuit 3 according to the second embodiment, when a length of the area in which the DC circuit 6 is interposed between the oscillation circuit 4 and the output circuit 5 in a direction in which the oscillation circuit 4 is connected to the output circuit 5 is 0.5 times or more, and one time or less of the shorter one of the lengths in the first direction of the oscillation circuit 4 and the output circuit 5, for example, even when the oscillation circuit 4 and the output circuit 5 are obliquely disposed so as to interpose the DC circuit 6, it is possible to efficiently decrease electromagnetic coupling between the oscillation circuit 4 and the output circuit 5 caused by a shield effect obtained by the DC circuit 6.

1-3. Third Embodiment

Figure 4:
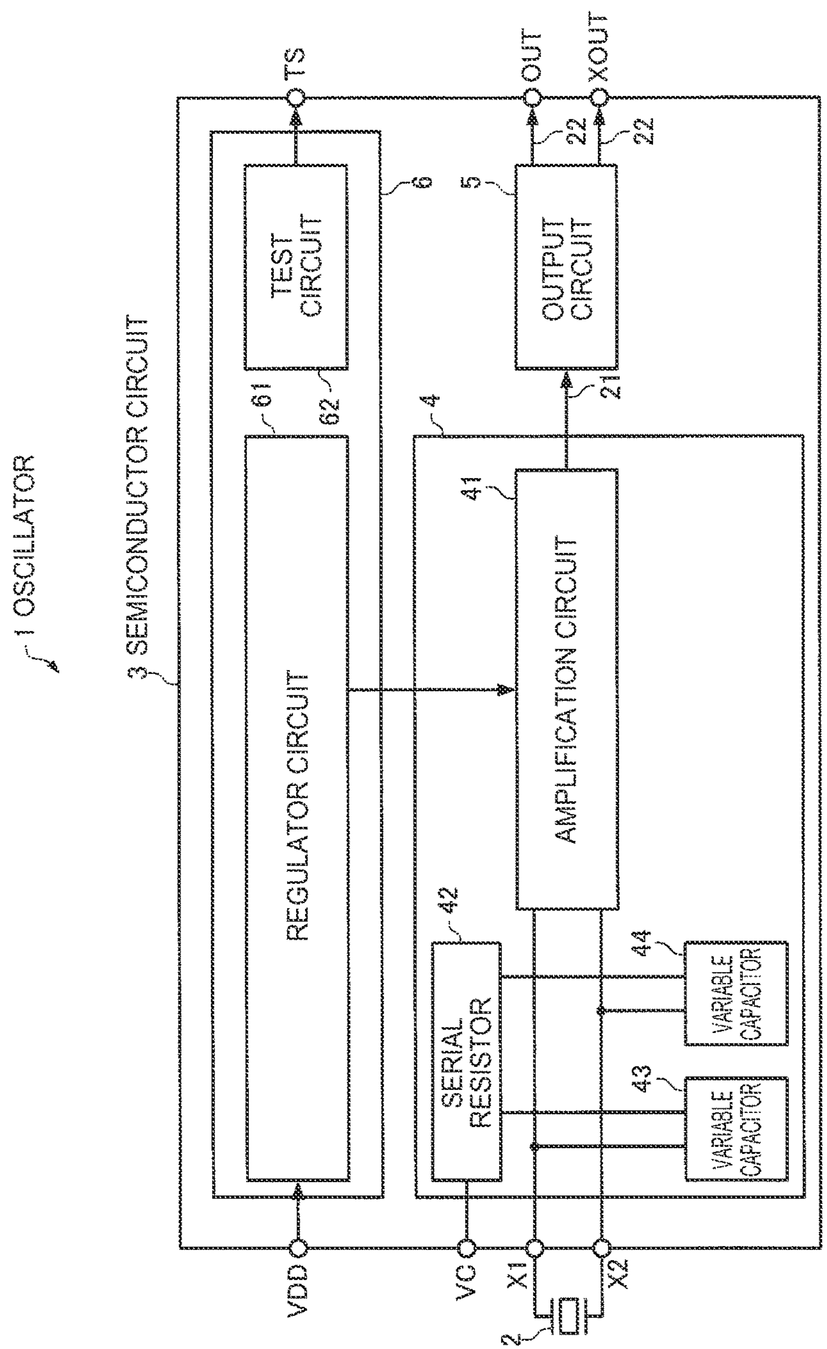
FIG. 4 is a configuration diagram of an oscillator according to a third embodiment.

FIG. 4 is a block diagram illustrating a configuration of an oscillator according to a third embodiment. In FIG. 4, the same symbols or reference numerals will be attached to the same configuration elements as in FIG. 1. As illustrated in FIG. 4, the oscillator 1 according to the third embodiment is configured to include the resonator 2 and the semiconductor circuit 3, and the resonator 2 and the semiconductor circuit 3 are contained in a package that is not illustrated.

In the third embodiment, the resonator 2 is, for example, a crystal vibrator, and two terminals thereof are respectively and electrically connected to an external terminal X1 and an external terminal X2 of the semiconductor circuit 3.

The semiconductor circuit 3 is configured to include the oscillation circuit 4, the output circuit 5, and the DC circuit 6. The semiconductor circuit 3 may be an integrated circuit (IC).

The oscillation circuit 4 is configured to include an amplification circuit 41, a serial resistor 42, and variable capacitors 43 and 44, and outputs the oscillation signal 21 (first oscillation signal) by oscillating the resonator 2 (crystal vibrator).

The amplification circuit 41 is electrically connected to the external terminal X1 and the external terminal X2 of the semiconductor circuit 3. Thus, the amplification circuit 41 is electrically connected to the resonator 2 (crystal vibrator) through the external terminal X1 and the external terminal X2 of the semiconductor circuit 3, and amplifies an output signal of the resonator 2 (crystal vibrator) that is input through, for example, the external terminal X1, and feeds back the amplified signal to the resonator 2 (crystal vibrator) through the external terminal X2. The amplification circuit 41 may be an amplification circuit using, for example, a bipolar transistor, and may be an amplification circuit using a CMOS transistor.

Capacitance values of the variable capacitors 43 and 44 change according to voltages that are input through the serial resistor 42 from an external terminal VC of the semiconductor circuit 3. The variable capacitors 43 and 44 function as a portion of load capacitance of the resonator 2 (crystal vibrator), and an oscillation frequency of the resonator 2 (crystal vibrator) changes in accordance with the capacitance values of the variable capacitors 43 and 44.

The amplification circuit 41 may be configured to include, for example, a buffer circuit, a level shift circuit for outputting the oscillation signal 21 that is obtained by converting and amplifying the amplitude level of the amplified output signal of the resonator 2 (crystal vibrator), and a frequency dividing circuit that divides the frequency of the amplified output signal of the resonator 2 (crystal vibrator).

The oscillation circuit 4 having the configuration functions as a voltage controlled oscillation circuit that changes the frequency (oscillation frequency) of the oscillation signal 21, in accordance with a voltage value of the external terminal VC. For example, a fixed voltage may be input from the external terminal VC, and a signal for temperature compensation which changes depending on temperature may be input.

The output circuit 5 receives the oscillation signal 21 output from the oscillation circuit 4, and outputs a differential oscillation signal 22. The output circuit 5 may output the differential oscillation signal 22 corresponding to an interface, such as low voltage positive emitter coupled logic (LV-PECL), or low voltage differential signaling (LVDS). The differential oscillation signal 22 is output from an external terminal OUT and an external terminal XOUT of the semiconductor circuit 3 to an external device. For example, the output circuit 5 may be configured to include a frequency dividing circuit that divides the frequency of the oscillation signal 21.

The DC circuit 6 is configured to include a regulator circuit 61 and a test circuit 62.

The DC circuit 6 may include a band gap reference (BGR) that generates a reference voltage based on a power supply voltage which is input from an external terminal (power supply terminal) VDD, using a band gap of semiconductor. The DC circuit 6 may include a voltage regulator that generates a constant voltage, or a current regulator that generates a constant current, based on at least one of the power supply voltage or a current which are input from the external terminal VDD.

The test circuit 62 is a circuit for selecting a constant voltage, a constant current or the like that is generated by the regulator circuit 61, for controlling that the constant voltage or the constant current is output to an external device through an external terminal TS of the semiconductor circuit 3, and for controlling whether to make the output of the oscillation signal 22 from the output circuit 5 active or inactive (stop), in accordance with a voltage that is input from a terminal (not illustrated) of the semiconductor circuit 3.

Both of the regulator circuit 61 and the test circuit 62 are static circuits that input voltages based on the power supply voltage that is input from the external terminal VDD of the semiconductor circuit 3 and output at least one of a DC voltage and a DC current.

Figure 5:
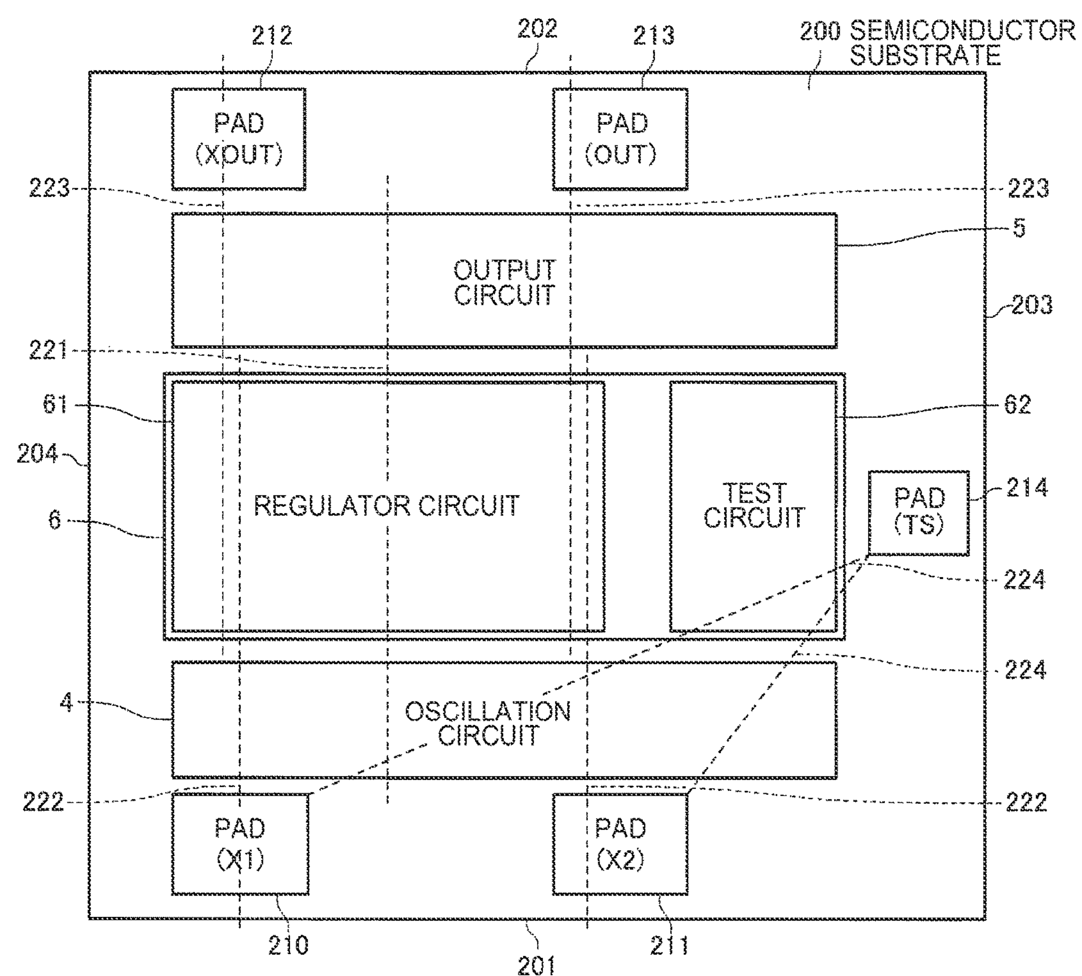
FIG. 5 is a diagram illustrating an example of a layout arrangement of a semiconductor circuit according to the third embodiment.

FIG. 5 is a diagram illustrating an example of a layout arrangement of the semiconductor circuit 3 of the oscillator 1 according to the third embodiment. In FIG. 5, the two pads that are respectively and electrically connected to the external terminals VDD and VC which are illustrated in FIG. 4 are not illustrated. As illustrated in FIG. 5, the semiconductor circuit 3 includes the oscillation circuit 4, the output circuit 5, and the DC circuit 6 which are illustrated in FIG. 4, on a semiconductor substrate 200. In a plan view of the semiconductor substrate 200, the regulator circuit 61 and the test circuit 62 which are included in the DC circuit 6 are disposed between the oscillation circuit 4 and the output circuit 5. However, all circuits that are included in the DC circuit 6 need not be disposed between the oscillation circuit 4 and the output circuit 5, and all circuits that are included in the DC circuit 6 may not be disposed between the oscillation circuit 4 and the output circuit 5. For example, in a plan view of the semiconductor substrate 200, the DC circuit 6 may be disposed so as to intersect at least one of virtual straight lines 221 that intersect (for example, orthogonal to) both of the oscillation circuit 4 and the output circuit 5, between the oscillation circuit 4 and the output circuit 5.

In addition, the semiconductor circuit 3 includes pads 210 (first pad) and 211 (first pad) on the semiconductor substrate 200. The pads 210 and 211 are electrically connected to the oscillation circuit 4, and electrically connected to terminals (two terminals) of the resonator 2. Specifically, the pad 210 is electrically connected to an external terminal X1 of the semiconductor circuit 3, and is electrically connected to one terminal of the resonator 2 through the external terminal X1. In addition, the pad 211 is electrically connected to the external terminal X2 of the semiconductor circuit 3, and is electrically connected to the other terminal of the resonator 2 through the external terminal X2.

In addition, the semiconductor circuit 3 includes pads 212 (second pad) and 213 (second pad) on the semiconductor substrate 200. The pad 212 is electrically connected to a terminal of the output circuit 5 that outputs an oscillation signal 22 on an inversion side, among differential oscillation signals 22. The pad 213 is electrically connected to a terminal of the output circuit 5 that outputs an oscillation signal 22 on a non-inversion side, among the differential oscillation signals 22. In addition, the pad 212 is electrically connected to an external terminal XOUT of the semiconductor circuit 3, and the pad 213 is also electrically connected to the external terminal OUT of the semiconductor circuit 3.

In the present embodiment, in a plan view of the semiconductor substrate 200, the oscillation circuit 4 is disposed between the pad 210 (or the pad 211) and the DC circuit 6. For example, in a plan view of the semiconductor substrate 200, the oscillation circuit 4 may be disposed so as to intersect at least one of virtual straight lines 222 that intersect (for example, orthogonal to) both of the pad 210 (or the pad 211) and the DC circuit 6, between the pad 210 (or the pad 211) and the DC circuit 6.

In addition, in the present embodiment, in a plan view of the semiconductor substrate 200, the output circuit 5 is disposed between the pad 212 (or the pad 213) and the DC circuit 6. For example, in a plan view of the semiconductor substrate 200, the output circuit 5 may be disposed so as to intersect at least one of virtual straight lines 223 that intersect (for example, orthogonal to) both of the pad 212 (or the pad 213) and the DC circuit 6, between the pad 212 (or the pad 213) and the DC circuit 6.

The semiconductor substrate 200 includes a side 201 (first side), a side 202 (second side), and a plurality of sides 203 and 204 that respectively connects the side 201 to the side 202. For example, the semiconductor substrate 200 is a rectangle, and in a plan view of the semiconductor substrate 200, the pad 210 and the pad 211 are disposed between the side 201 and the oscillation circuit 4. For example, in a plan view of the semiconductor substrate 200, the pad 210 and the pad 211 may be disposed so as to intersect at least one of the virtual straight lines 222 that intersect (for example, orthogonal to) both of the side 201 and the oscillation circuit 4, between the side 201 and the oscillation circuit 4.

In addition, in a plan view of the semiconductor substrate 20, the pads 212 and 213 are disposed between the side 202 and the output circuit 5. For example, in a plan view of the semiconductor substrate 200, the pads 212 and 213 may be disposed so as to intersect at least one of the virtual straight lines 223 that intersect (for example, orthogonal to) both of the side 202 and the output circuit 5, between the side 202 and the output circuit 5.

In addition, the semiconductor circuit 3 may include a pad 214 (third pad) on the semiconductor substrate 200. The pad 214 is a pad for confirming an operation state of the semiconductor circuit 3, and is electrically connected to the semiconductor circuit 3. The pad 214 is electrically connected to the output terminal of the test circuit 62. In addition, the pad 214 is also electrically connected to an external terminal TS of the semiconductor circuit 3. In a plan view of the semiconductor substrate 200, the pad 214 is disposed along the side 203 that is one of a plurality of sides that connects the side 201 to the side 202. The DC circuit 6 intersects a virtual straight line 224 that connects the pad 214 to the pad 210 (or the pad 211).

According to the oscillator 1 or the semiconductor circuit 3 of the third embodiment described above, the DC circuit 6 (particularly, regulator circuit 61) is disposed between the oscillation circuit 4 and the output circuit 5 that respectively generate the oscillation signals 21 and 22 with frequency components, the DC circuit 6 functions as an electromagnetic shield, and thus, electromagnetic coupling between the oscillation circuit 4 and the output circuit 5 is reduced. Thus, according to the oscillator 1 or the semiconductor circuit 3 of the third embodiment, it is possible to reduce characteristic degradation of an output signal due to interference between the signal of the oscillation circuit 4 and the signal of the output circuit 5, that is, characteristic degradation of the oscillation signal 21 or the oscillation signal 22. For example, it is possible to reduce degradation of frequency stability of the oscillation signal 21 that is output from the oscillation circuit 4, or to reduce phase noise or jitter of the oscillation signal 22 that is output from the output circuit 5.

Furthermore, the output circuit 5 includes a frequency dividing circuit, and when the oscillation signal 22 which is obtained by dividing the frequency of the oscillation signal 21 using the frequency dividing circuit is output, the frequency of the oscillation signal 21 becomes an integer multiple of the frequency of the oscillation signal 22. Thus, spurious emissions of harmonics likely to occur in the oscillation signal 22. However, the DC circuit 6 functions as an electromagnetic shield, and thus it is possible to reduce the spurious emission.

In addition, according to the oscillator 1 or the semiconductor circuit 3 of the third embodiment, the pads 210 and 211 connected to the oscillation circuit 4 and the resonator 2 are disposed along the side 201 of the semiconductor substrate 200, the pads 212 and 213 connected to the output circuit 5 are disposed along the side 202 separated from the side 201 of the semiconductor substrate 200, and the oscillation circuit 4, the output circuit 5, and the DC circuit 6 are disposed between the pads 210 and 211, and the pads 212 and 213. Thus, the pads 210 and 211, and the pads 212 and 213 are separated from each other, the DC circuit 6 is disposed between the pads 210 and 211 and the pads 212 and 213, and thus electromagnetic coupling between the pads 210 and 211 and the pad 212 is reduced. In addition, since the pad 210 and the pad 211 are disposed along the side 201 of the semiconductor substrate 200, the pad 210 and the pad 211 are respectively and easily connected to the external terminal X1 and the external terminal X2 of the semiconductor circuit 3. At the same time, since the pad 212 and the pad 213 are disposed along the side 202 of the semiconductor substrate 200, the pad 212 and the pad 213 are respectively and easily connected to the external terminal XOUT and the external terminal OUT of the semiconductor circuit 3.

In addition, according to the oscillator 1 or the semiconductor circuit 3 of the third embodiment, the DC circuit 6 is disposed between the pads 210 and 211 connected to the oscillation circuit 4 and the pad 214 for confirming an operation state of the semiconductor circuit 3, and thereby, electromagnetic coupling between the oscillation circuit 4 and the pad 214 is reduced. Thus, for example, it is possible to decrease the possibility of malfunction of the semiconductor circuit 3 due to noise being superimposed on the pad 214 electrically connected to the external terminal TS that is a test terminal, by the oscillation circuit 4.

In addition, According to the oscillator 1 or the semiconductor circuit 3 of the third embodiment, the regulator circuit 61 that includes at least one of a voltage regulator and a current regulator that is a static circuit is used as a shield for decreasing electromagnetic coupling between the oscillation circuit 4 and the output circuit 5, and thus it is possible to perform an efficient layout arrangement of the semiconductor circuit 3.

2. Electronic Apparatus

Figure 6:
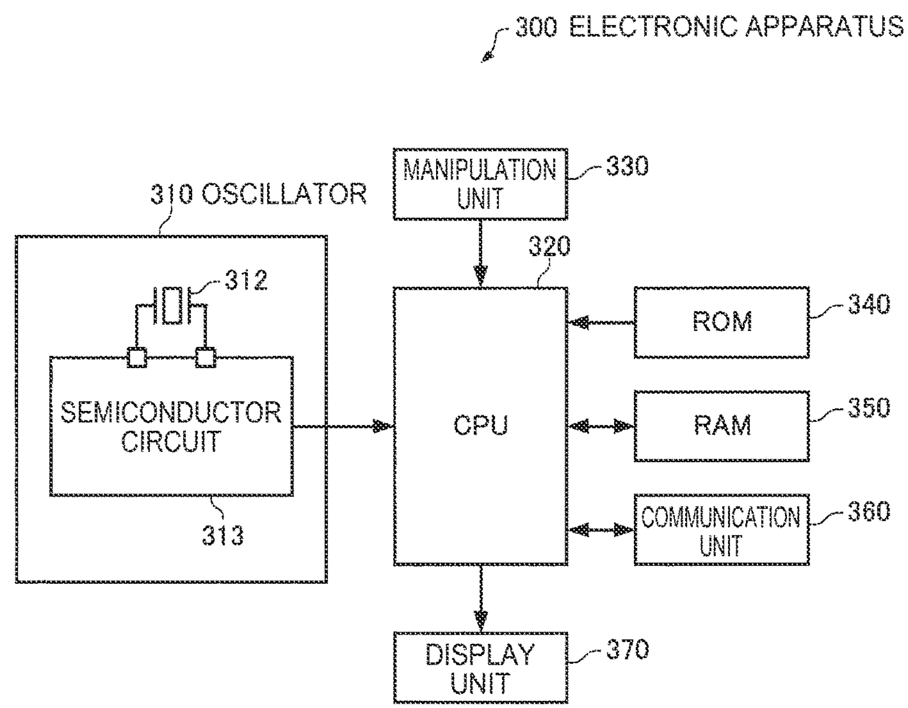
FIG. 6 is a functional block diagram illustrating an example of a configuration of an electronic apparatus according to the present embodiment.

FIG. 6 is a functional block diagram illustrating an example of a configuration of an electronic apparatus according to the present embodiment. An electronic apparatus 300 according to the present embodiment is configured to include an oscillator 310, a central processing unit (CPU) 320, a manipulation unit 330, a read only memory (ROM) 340, a random access memory (RAM) 350, a communication unit 360, and a display unit 370. The electronic apparatus according to the present embodiment may have a configuration in which a portion of the configuration elements (each unit) of FIG. 6 is omitted or modified, or other configuration elements are added.

The oscillator 310 includes a resonator 312 and a semiconductor circuit 313. The semiconductor circuit 313 generates an oscillation signal by oscillating the resonator 312. This oscillation signal is output from the oscillator 310 to the CPU 320.

The CPU 320 performs various types of calculation processing or control processing, using the oscillation signal that is input from the oscillator 310 as a clock signal, according to a program stored in the ROM 340 or the like. Specifically, the CPU 320 performs various types of processing in response to a manipulation signal from the manipulation unit 330, processing of controlling the communication unit 360 for performing data communication with an external device, processing of transmitting a display signal for displaying various types of information on the display unit 370, or the like.

The manipulation unit 330 is an input device that is configured by manipulation keys, button switches, or the like, and outputs a manipulation signal according to manipulation performed by a user to the CPU 320.

The ROM 340 stores programs, data, or the like by which the CPU 320 performs various types of calculation processing or control processing.

The RAM 350 is used as a working area of the CPU 320, and temporarily stores a program or data that is read from the ROM 340, data that is input from the manipulation unit 330, result of operations that are performed by the CPU 320 according to various types of programs, or the like.

The communication unit 360 performs various types of controls for data communication between the CPU 320 and an external device.

The display unit 370 is a display device that is configured by a liquid crystal display (LCD) or the like, and displays various types of information based on a display signal that is input from the CPU 320. The display unit 370 may include a touch panel that functions as the manipulation unit 330.

The semiconductor circuit 3 according to the respective embodiments described above is applied as a semiconductor circuit 313. Alternatively, by applying the oscillator 1 according to the respective embodiments described above as the oscillator 310, it is possible to realize an electronic apparatus with high reliability.

Various electronic apparatuses, such as, a personal computer (for example, a mobile type personal computer, a laptop type personal computer, a tablet type personal computer), a mobile terminal such as a smart phone or a cellular phone, a digital camera, an ink jet type ejecting device (for example, an ink jet printer), a storage area network apparatus such as a router or a switch, a local area network apparatus, an apparatus for a mobile terminal base station, a television, a video camera, a video recorder, a car navigation device, a real time clock device, a pager, an electronic notebook (including communication function), an electronic dictionary, an electronic calculator, an electronic game machine, a controller for game, a word processor, a work station, a video phone, a video monitor for security, electronic binoculars, a POS terminal, a medical apparatus (for example, an electronic thermometer, a blood pressure meter, a blood glucose meter, an electrocardiogram measuring device, an ultrasonic diagnostic device, an electronic endoscope), a fish finder, various measurement apparatuses, instruments (for example, gauges of a vehicle, an airplane, or a ship), a flight simulator, a head-mounted display, a motion tracing device, a motion tracking device, a motion controller, or a pedestrian position orientation measurement (PDR), are considered as the electronic apparatus 300.

As an example of the electronic apparatus 300 according to the present embodiment, the above-described oscillator 310 is used as a reference signal source, a voltage controlled oscillator (VCO), or the like. For example, a transmission device functioning as a device for a terminal base station or the like that performs wired or wireless communication with a terminal is used. The electronic apparatus 300 according to the present embodiment adopts, for example, the semiconductor circuit 3 according to the respective embodiments described above, or adopts, for example, the oscillator 1 according to the respective embodiments described above, as the oscillator 310, and thereby the semiconductor circuit 313 can output an oscillation signal with low noise and low jitter. Thus, it is also possible to apply high performance and high reliability that can be used in, for example, a communication base station or the like to a desired transmission apparatus.

3. Moving Object

Figure 7:
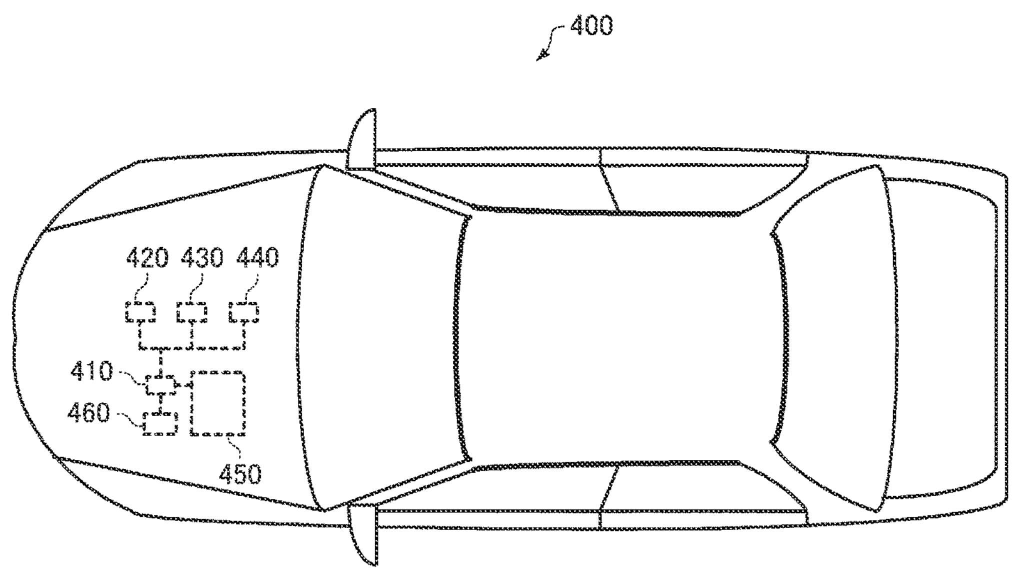
FIG. 7 is a view illustrating an example of a moving object according to the present embodiment.

FIG. 7 is a view (top view) illustrating an example of a moving object according to the present embodiment. The moving object 400 illustrated in FIG. 7 is configured to include an oscillator 410, controllers 420, 430, and 440 that performs various types of control for an engine system, a brake system, a keyless entry system, and the like, a battery 450, and a back-up battery 460. The moving object according to the present embodiment may have a configuration in which a portion of the configuration elements (each unit) of FIG. 7 is omitted, or other configuration elements are added.

The oscillator 410 includes a semiconductor circuit and an oscillator which are not illustrated, and the semiconductor circuit generates an oscillation signal by oscillating the oscillator. The oscillation signal is output from an external terminal of the oscillator 410 to the controllers 420, 430, and 440, and is used as, for example, a clock signal.

The battery 450 supplies power to the oscillator 410 and the controllers 420, 430, and 440. The back-up battery 460 supplies power to the oscillator 410 and the controllers 420, 430, and 440, when an output voltage of the battery 450 is lower than a threshold.

For example, the semiconductor circuits 3 according to the respective embodiments described above are applied as the semiconductor circuit that is included in the oscillator 410, or, for example, the oscillators 1 according to the respective embodiments are applied as the oscillator 410, and thus it is possible to realize a moving object with high reliability.

Various moving objects, such as, a car (including an electric car), an aircraft such as a jet airplane or a helicopter, a ship, a rocket, and a satellite are considered as the moving object 400.

The invention is not limited to the present embodiments, and various modifications can be made within the scope of the invention.

For example, the oscillator 1 according to the third embodiment described above is a voltage controlled crystal oscillator (VCXO) including the oscillation circuit 4 that functions as a voltage controlled oscillation circuit, but in addition to this, the invention can be applied to various oscillators, such as, a temperature compensated crystal oscillator (TXCO or the like), an oven controlled crystal oscillator (OCXO or the like), an oscillator (a voltage controlled temperature compensated crystal oscillator (VC-TCXO) or the like) having both a voltage control function and a temperature compensation function, and an oscillator (simple packaged crystal oscillator (SPXO) or the like) having no voltage control function or temperature compensation function.

The above-described embodiments and modification examples are examples, and the invention is not limited to these. For example, it is possible to appropriately combine each embodiment and each modification example.

The invention includes substantially the same configuration (for example, a function, a configuration having the same method and result, or a configuration having the same object and effect) as the configuration described in the embodiments. In addition, the invention includes a configuration in which the units of the configuration described above which are not essential are replaced. In addition, the invention includes a configuration having the same action and effect as the configuration described in the embodiments, or a configuration by which the same object can be achieved. In addition, the invention includes a configuration in which a known technology is added to the configuration described in the embodiments.

The entire disclosure of Japanese Patent Application No. 2014-197150, filed Sep. 26, 2014 is expressly incorporated by reference herein.

What is claimed is:

1. A semiconductor circuit comprising:

an oscillation circuit that outputs a first oscillation signal;

an output circuit that receives the first oscillation signal and outputs a second oscillation signal;

a DC circuit that outputs at least one of a DC voltage and a DC current to the oscillation circuit;

a first pad that is electrically connected to the oscillation circuit and is electrically connected to a terminal of a resonator; and a second pad that is electrically connected to a terminal of the output circuit from which the second oscillation signal is output; and a semiconductor substrate on which the oscillation circuit, the output circuit, the DC circuit, the first pad, and the second pad are formed, wherein, in a plan view of the semiconductor substrate, the DC circuit is disposed between the oscillation circuit and the output circuit, and the oscillation circuit is disposed between the first pad and the DC circuit, and the output circuit is disposed between the second pad and the DC circuit.

2. The semiconductor circuit according to claim 1, wherein the semiconductor substrate includes a first perimeter side opposite a second perimeter side, and wherein, in a plan view of the semiconductor substrate, the first pad is disposed between the first perimeter side and the oscillation circuit, and the second pad is disposed between the second perimeter side and the output circuit.

3. The semiconductor circuit according to claim 2, wherein, in a plan view of the semiconductor substrate, the DC circuit intersects a virtual straight line that connects the second pad to the first pad.

4. The semiconductor circuit according to claim 1, wherein:

in a plan view of the semiconductor substrate, the output circuit and oscillator circuit are offset from each other as referenced from a virtual straight line perpendicular to the first perimeter side, and define an overlap area between them as defined along the virtual straight line perpendicular to the first perimeter side; and the DC circuit is positioned on the semiconductor substrate to span the entirety of the overlap area along a spanning direction perpendicular to the virtual straight line.

5. The semiconductor circuit according to claim 4, wherein the length of the overlap area (L1) along a spanning direction is not less than half the length of the oscillation circuit (L2) along the spanning direction, and is not greater than the length of the oscillation circuit (L2) along the spanning direction.

6. An oscillator comprising:

the semiconductor circuit according to claim 1; and a resonator.

7. An electronic apparatus comprising:

the semiconductor circuit according to claim 1.

8. An electronic apparatus comprising:

the oscillator according to claim 6.

9. A moving object comprising:

the semiconductor circuit according to claim 1.

10. A moving object comprising:

the oscillator according to claim 6.

11. The semiconductor circuit according to claim 1, wherein:

the semiconductor substrate includes a first perimeter side opposite a second perimeter side;

in a plan view of the semiconductor substrate, the oscillation circuit, the DC circuit, and the output circuit are a same length between their respective left-most side and right-most side along a direction parallel to the first perimeter side; and the oscillation circuit, the DC circuit, and the output circuit have their respective left-most sides aligned to each other.

12. The semiconductor circuit according to claim 1, wherein:

in a plan view of the semiconductor substrate, the oscillation circuit, the DC circuit, and the output circuit have a respective primary length defined by their respective left-most side and opposite right-most side; and the oscillation circuit, the DC circuit, and the output circuit have their respective left-most sides aligned to each other; and the oscillation circuit, the DC circuit, and the output circuit have their respective primary lengths parallel to each other.

13. The semiconductor circuit according to claim 1, wherein the DC circuit is a DC regulator that receives a voltage based on a power supply voltage and that outputs said at least one of a DC voltage and a DC current to the oscillation circuit and does not provide said at least one of a DC voltage and a DC current to the output circuit.

14. A semiconductor circuit comprising:

an oscillation circuit that outputs a first oscillation signal;

an output circuit that receives the first oscillation signal and outputs a second oscillation signal;

a DC circuit that outputs at least one of a DC voltage and a DC current to the oscillation circuit; and a semiconductor substrate on which the oscillation circuit, the output circuit, and the DC circuit are formed, wherein, in a plan view of the semiconductor substrate, the DC circuit is disposed between the oscillation circuit and the output circuit;

wherein the oscillation circuit includes an amplification circuit that receives said at least one of a DC voltage and a DC current from the DC circuit, and that outputs said first oscillation signal, and wherein the DC circuit is a DC regulator that outputs said at least one of a DC voltage and a DC current to the oscillation circuit and does not provide a DC signal to the output circuit.

15. The semiconductor circuit according to claim 14, further comprising:

a first resonator pad (X1) and a second resonator pad (X2) on the substrate and that are electrically connected to the oscillation circuit, the amplification circuit also being directly connected to the first resonator pad (X1) and to the second resonator pad (X2);

a resonator having a first terminal electrically connected to the first resonator pad (X1), and having a second terminal electrically connected to the second resonator pad (X2); and an output pad on the substrate, the output pad being electrically connected to an output of the output circuit from which the second oscillation signal is output.

16. A semiconductor circuit comprising:

an oscillation circuit that outputs a first oscillation signal;

an output circuit that receives the first oscillation signal and outputs a second oscillation signal;

a DC circuit that outputs at least one of a DC voltage and a DC current to the oscillation circuit; and a semiconductor substrate on which the oscillation circuit, the output circuit, and the DC circuit are formed, wherein, in a plan view of the semiconductor substrate, the DC circuit is disposed between the oscillation circuit and the output circuit;

wherein:

the DC circuit include a DC regulator and a test circuit, said DC regulator being configured to generate and output said at least one of a DC voltage and a DC current to the oscillation circuit, said test circuit being configured to confirm an operating state of the semiconductor circuit; and in a plan view of the semiconductor substrate, the test circuit lays between the output circuit and the oscillator circuit.

17. The semiconductor circuit according to claim 16, wherein in the plan view of the semiconductor substrate, the test circuit lays wholly between the output circuit and the oscillator circuit.

18. The semiconductor circuit according to claim 16, wherein the semiconductor substrate includes a first perimeter side opposite a second perimeter side, said semiconductor circuit further comprising:

a first resonator pad (X1) and a second resonator pad (X2) along the first perimeter side of the substrate, the first resonator pad (X1) and second resonator pad (X2) being electrically connected to the oscillation circuit;

an output pad along the second perimeter side of the substrate, the output pad being electrically connected to an output of the output circuit from which the second oscillation signal is output; and a test pad along a third perimeter side of the substrate, the third perimeter side being perpendicular to the first perimeter side, and the test pad being electrically connected to the test circuit;

wherein, in a plan view of the semiconductor substrate, the first resonator pad (X1) and a second resonator pad (X2) lay between the oscillation circuit and the first perimeter side of the substrate, the output pad lays between the second the output circuit and the second perimeter side of the substrate, and the test pad lays between the test circuit and the third perimeter side of the substrate.

* * * * *